United States Patent [19]

Oh et al.

[11] Patent Number: 5,731,592
[45] Date of Patent: Mar. 24, 1998

[54] EXHAUST SYSTEM FOR AN ION IMPLANTER

[75] Inventors: Sang-Guen Oh, Suwon; Sang-Young Moon, Ansan; Jueng-Gon Kim; Chan-Woo Park, both of Suwon, all of Rep. of Korea

[73] Assignee: Samsung Electronics Co., Ltd., Suwon, Rep. of Korea

[21] Appl. No.: 774,276

[22] Filed: Dec. 27, 1996

[30] Foreign Application Priority Data

Dec. 29, 1995 [KR] Rep. of Korea ............... 1995-67565

[51] Int. Cl.[6] ............................................. H01J 37/317
[52] U.S. Cl. ............................ 250/492.21; 250/441.11
[58] Field of Search ......................... 250/492.21, 441.11

[56] References Cited

U.S. PATENT DOCUMENTS

| 5,308,989 | 5/1994 | Brubaker | 250/492.21 |
| 5,312,519 | 5/1994 | Sakai et al. | 250/441.11 |

FOREIGN PATENT DOCUMENTS 4-272643  9/1992  Japan ................ 250/492.21

Primary Examiner—Jack I. Berman
Attorney, Agent, or Firm—Jones & Volentine, L.L.P.

[57] ABSTRACT

An exhaust system for an ion implanter includes an exhaust pump for removing remaining gases in an inner portion of the ion implanter, an exhaust duct for carrying the remaining gases from the exhaust pump to the outside of the exhaust system, and a gas introducing portion for introducing heated gases from a gas storage tank to the exhaust duct. Therefore, by-products on an inside of the exhaust duct are heated by the gases, such that a reaction between the remaining gases from the exhaust pump and the heated by-products is prevented. With the exhaust system, a corona discharge is not generated inside the exhaust duct, thereby preventing the exhaust duct from being burned out.

4 Claims, 2 Drawing Sheets

EXHAUST SYSTEM FOR AN ION IMPLANTER

BACKGROUND OF THE INVENTION

1. Field of the Invention

The present invention relates to an exhaust system for an ion implanter in which water ($H_2O$) is not produced so as to prevent the occurrence of a corona discharge inside an exhaust duct thereof.

2. Description of the Related Art

In a semiconductor manufacturing process, ion implanters are used for implanting ionized dopants into the surface of a masked wafer by accelerating them at high speed. The ion implanter has been developed to the point where the amount of impurities and the distribution of impurities into a wafer can be easily controlled.

Ion implanters are broadly classified into two types; a medium current ion implanter, which requires a beam current of 0.5 mA to 2 mA, and a large current ion implanter, which requires a beam current of 2 mA to 30 mA.

Ion implanters are also classified as wafer-to-wafer or double-wafer systems. Wafer-to-wafer systems load and process the wafers one by one in a manufacturing room. Although there is a high completion rate of implantation, the processing amounts per unit hour are small. Accordingly, ion implanters using a double-wafer manufacturing room enhance the processing amount per unit hour and are widely used.

All of the above ion implanters comprise (1) an ion implanting source portion for producing impurity ions, (2) a beam line portion for applying an energy to the produces ions, (3) an end station portion having a load-lock portion for smoothly loading and unloading the wafer by controlling a vacuum state or an air state of the wafer manufacturing room, and (4) an exhaust system, which is disposed at a lower portion of the ion implanter, for exhausting remaining gases from the inner portion of the ion implanter after the completion of the ion implantation process.

As illustrated in FIG. 1, the exhaust system of the ion implanter has an exhaust pump 12, which is connected and disposed in communication with the inner portion of the ion implanter 10. The exhaust pump 12 is provided to exhaust the remaining gases from the inner portion of the ion implanter in response to an operational signal. The exhaust system further has an exhaust duct 16 having one end connected to the exhaust pump 12 and the other end connected to a main duet 14 so as to dispense the gases exhausted from the exhaust pump 12 to the outside. The exhaust duet 16 is formed of a polyvinyl chloride (PVC), which can withstand high voltages because of its fixed dielectric strength.

However, in the exhaust system of the ion implanter, as the cool by-product adhered on an inside surface of the exhaust duct 16 and the hot by-product exhausted from the exhaust pump 12 contact and condense with each other, a compound containing $H_2O$ is then formed as a new by-product, namely, $Fe+H_2O+(As_3+PH_3+BH_3)$.

As illustrated in FIG. 2 and the following reaction formulas (1) and (2), $As_2O_5$ and $P_2O_5$ components are formed and, when combined with the Fe and $H_2O$ components of the new by-product, the inside wall of the exhaust duct 16 of PVC is contaminated and thus the dielectric strength is rapidly degraded. As a result, the insulation of the exhaust duct 16 is broken down by the high voltage applied to the ion implanter so that a corona discharge may be generated inside the exhaust duct.

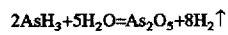  (1)

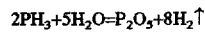  (2)

The corona discharge exerts a negative influence on the characteristics of fabricated semiconductor devices, since the ion implanter switches from a stable state to an unstable state.

If such a corona discharge occurs frequently inside the exhaust duct 16 and increases in strength, a hydrogen compound produced as a by-product of the above reactions may be ignited by the corona discharge, and thereby the exhaust duct 16 of PVC is burned out.

As is stated above, there are two factors that cause the corona discharge. One is the Fe component that is produced from the exhaust pump, namely, a dry pump, and introduced inside the exhaust duct 16. The other is the $H_2O$ component, which is produced by condensation between a hot by-product introduced from the outside to the inside of the exhaust duct, or that is newly dispensed from the exhaust pump, and a cool by-product previously existing inside the exhaust duct.

If one of the factors is not present in the exhaust system, the corona discharge is not generated therein, preventing the exhaust duct from being burned out. However, the Fe component can not be removed in such cases as these where an exhaust pump is used for the exhaust system. Also, since PVC has an excellent dielectric strength against high voltage, it is inevitably used to make an exhaust duct. Accordingly, to prevent the occurrence of corona discharge inside the exhaust duct, it is necessary to prevent the occurrence of $H_2O$ inside the exhaust duct.

SUMMARY OF THE INVENTION

The present invention substantially overcomes one or more of the problems described above. It is an object of the present invention to provide an exhaust system for an ion implanter, which prevents the occurrence of $H_2O$ inside an exhaust duct thereof so as to prevent a corona discharge from being generated inside the exhaust duct.

According to an aspect of the present invention, an exhaust system is adapted to an ion implanter used for implanting impurity ions on a surface of a semiconductor wafer, and comprises an exhaust pump for removing remaining gases in an inner portion of the ion implanter; an exhaust duct for carrying the remaining gases from the exhaust pump to outside of the exhaust system; and means for introducing heated gas from a gas storage tank to the exhaust duct, whereby by-products on an inside of the exhaust duct are heated by the gas, so that a condensation reaction between the remaining gases from the exhaust pump and the heated by-products is prevented.

In a preferred embodiment, the gas introducing means comprises a gas supply portion connected between the exhaust duct and the outside of the exhaust system so as to supply the heated gas to the exhaust duct. Also, one of the gases is nitrogen gas.

In a preferred embodiment, the gas supply portion further comprises a gas supply pipe connected between the gas storage tank and the exhaust duct, and a heater communicating with the gas supply pipe, for heating the gases flowing through the gas supply pipe.

Accordingly, as the high temperature nitrogen gas is supplied into the exhaust duct by means of the nitrogen supply portion, the generation of $H_2O$ can be prevented inside the exhaust duct, thereby preventing the corona discharge inside the exhaust duct.

BRIEF DESCRIPTION OF THE DRAWINGS

The accompanying drawings illustrate an embodiment of the invention, and, together with the description, serve to explain the principles of the invention, in which.

DESCRIPTION OF THE PREFERRED EMBODIMENT

A preferred embodiment of the present invention will now be described in detail with reference to the accompanying drawings.

Figure 1:
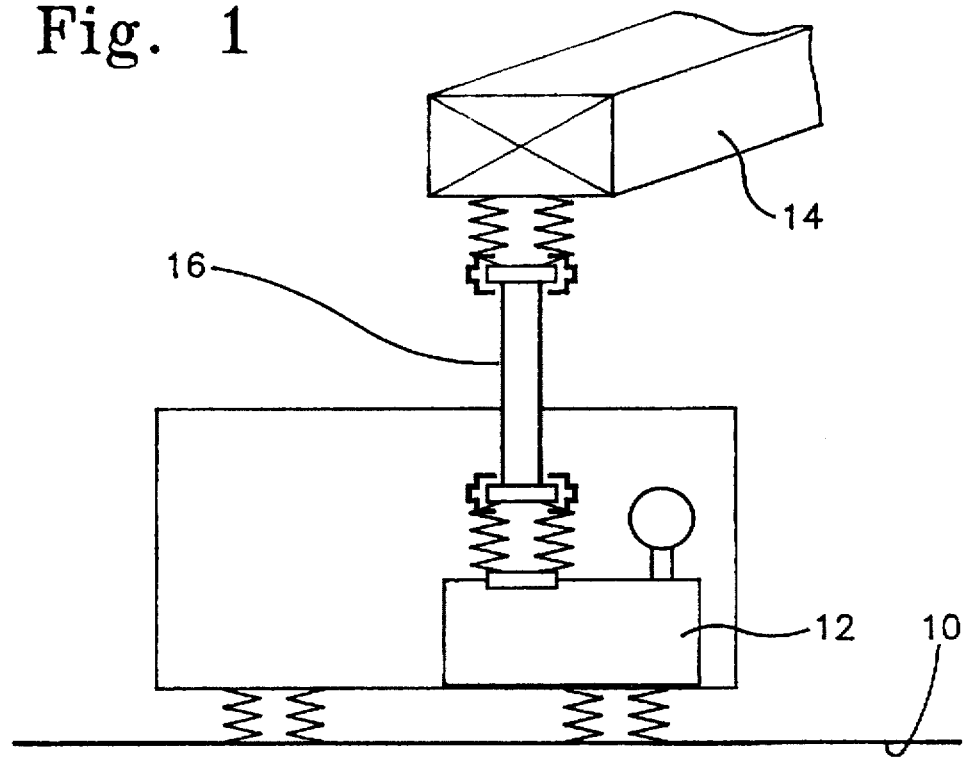
FIG. 1 is a schematic view illustrating a conventional exhaust system of an ion implanter.
Figure 2:
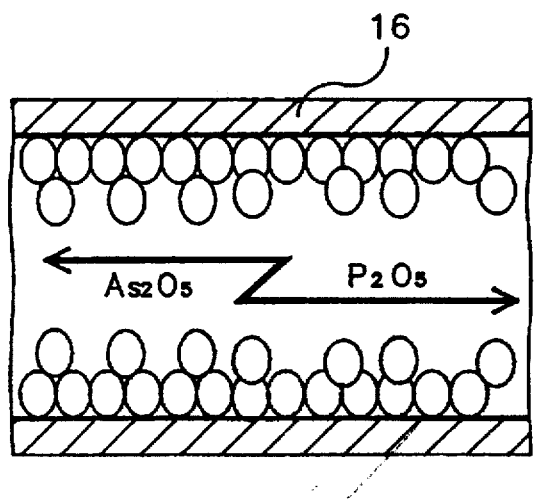
FIG. 2 is a partial cross-sectional view illustrating a condensation reaction in an exhaust duct of the conventional exhaust system shown in FIG. 1.
Figure 3:
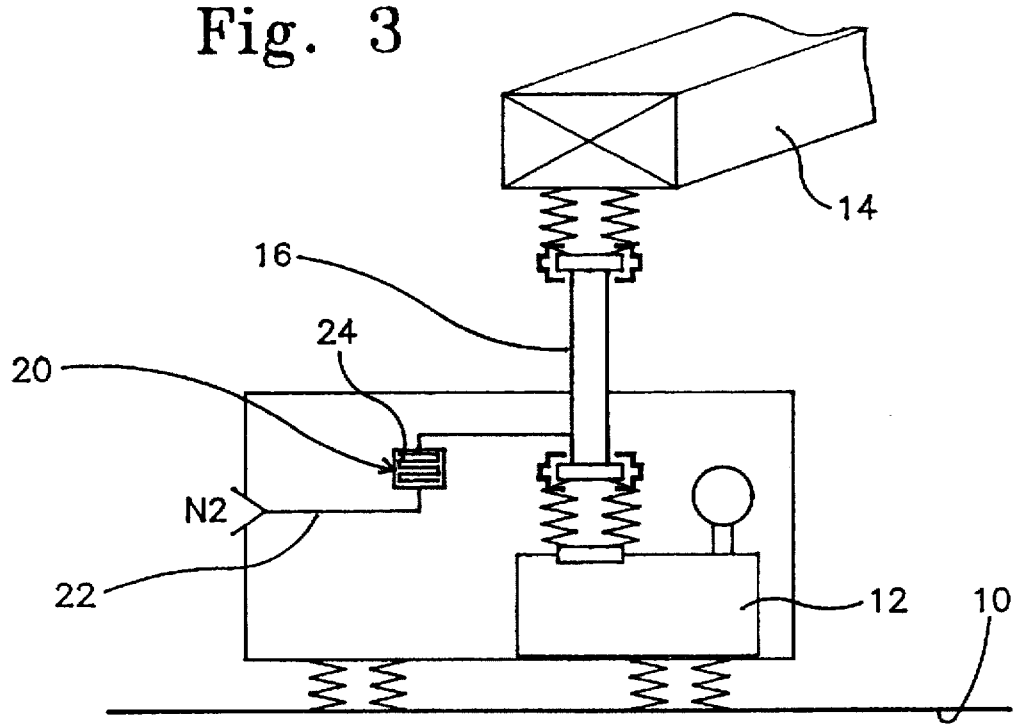
FIG. 3 is a schematic view illustrating a novel exhaust system of an ion implanter in accordance with a preferred embodiment of the present invention.

Referring to FIG. 3, there is schematically illustrated an exhaust system for an ion implanter in accordance with the present invention. The exhaust system has an exhaust pump 12, which is connected and disposed in communication with the inner portion of the ion implanter 10, and an exhaust duct 16 having one end connected to the exhaust pump 12 and the other end to a main duct 14. A gas introducing portion is connected to the exhaust duct 16. The gas introducing portion is provided to prevent contaminating materials from being produced inside the exhaust duct 16 by a reaction between exhaust gases from the exhaust pump 12 and a by-product remaining inside the exhaust duct 16. The gas introducing portion comprises a nitrogen supply portion 20, which is connected between the exhaust duct 16 and the outside of the exhaust system so as to supply high temperature nitrogen gas from the outside to the exhaust duct 16. The nitrogen supply portion 20 has a nitrogen gas supply pipe 22 connected between an outer nitrogen storage tank (not shown) and the exhaust duct 16, and a heater portion 24, which is fixedly disposed at a preferable position of the nitrogen gas supply pipe 22 to properly apply heat to the nitrogen supplied into the inner portion of the exhaust duct 16 through the nitrogen gas supply pipe 22.

The exhaust pump 12 exhausts the remaining gases in the inner portion of the ion implanter 10 in response to an operational signal. The exhaust duct 16 is provided to dispense the gases exhausted from the exhaust pump 12 to the outside. The exhaust duct 16 is formed of a polyvinyl chloride (PVC), which can withstand high voltages because of its fixed dielectric strength.

In the above exhaust system, as the exhaust pump 12 operates to exhaust the remaining gases inside the process chamber (not shown) of the ion implanter 10, nitrogen gas is supplied inside the exhaust duct 16 by means of the nitrogen supply portion 20. The nitrogen gas flowing through the pipe 22 is heated by the heater portion 24 prior to being introduced into the exhaust duct 16.

Figure 4:
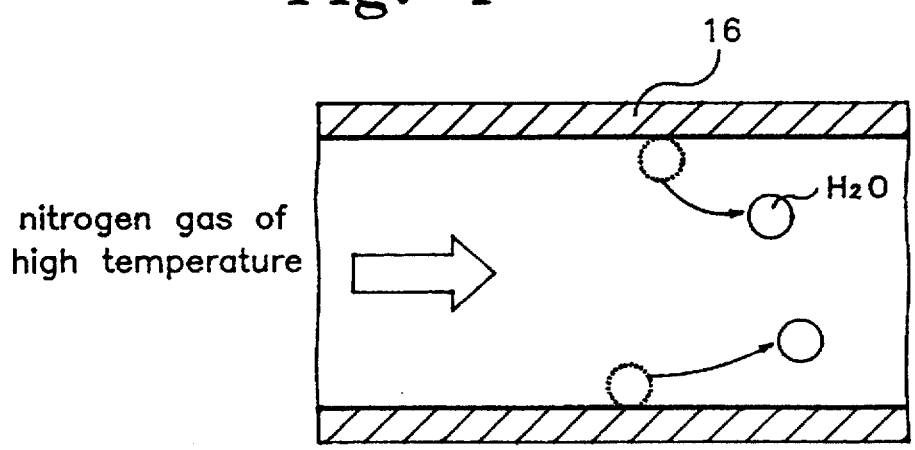
FIG. 4 is a partial cross-sectional view illustrating an operating state where nitrogen gas, having a high temperature, flows inside an exhaust duct of the novel exhaust system shown in FIG. 3.

As shown in FIG. 4, when the heated nitrogen gas is introduced inside the exhaust duct 16, by-products remaining on the inside wall of the exhaust duct 16 are heated by the heated nitrogen gas. As a result, condensation does not occur inside the exhaust duct 16, even though the new high temperature by-products from the exhaust pump 12 are introduced into the exhaust duct. This is because the by-products on the inside wall of the exhaust duct 16 are heated by the heated nitrogen gas. Thus, the generation of $H_2O$ inside the exhaust duct 16 can be prevented and thereby the $As_2O_5$ and $P_2O_5$ components are not produced because a chemical reaction between $H_2O$ and by-products such as $As_3$, $PH_3$ components, etc, is not generated.

With the present invention, the dielectric strength of the exhaust duct 16 is not suddenly lowered because the occurrence of $H_2O$, $As_2O_5$ and $P_2O_5$ components are prevented and therefore the high voltage does not cause a decrease in the dielectric strength. Therefore, the corona discharge is not generated inside an exhaust duct, preventing the exhaust duct from being burned out.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. An exhaust system for an ion implanter used for implanting impurity ions on a surface of a semiconductor wafer while fabricating semiconductor devices, comprising:

an exhaust pump for removing remaining gases in an inner portion of the ion implanter;

an exhaust duct for carrying the remaining gases from the exhaust pump to outside of the exhaust system; and means for introducing heated gases from a gas storage tank to the exhaust duct, whereby by-products on an inside of the exhaust duct are heated by the gases, so that a condensation reaction between the remaining gases from the exhaust pump and the heated by-products is prevented.

2. The exhaust system according to claim 1, wherein said gas introducing means comprises a gas supply portion connected between the exhaust duct and the outside of the exhaust system so as to supply the heated gases to the exhaust duct.

3. The exhaust system according to claim 1, wherein one of said gases is nitrogen gas.

4. The exhaust system according to claim 2, wherein said gas supply portion further comprises a gas supply pipe connected between the gas storage tank and the exhaust duct, and a heater communicating with the gas supply pipe for heating the gases flowing through the gas supply pipe.

* * * * *